(12) United States Patent
Kim (10) Patent No.: US 7,586,255 B2
(45) Date of Patent: Sep. 8, 2009

(54) ORGANIC ELECTRO-LUMINESCENT DISPLAY OF DUAL-PANEL TYPE AND METHOD FOR MANUFACTURING THE SAME

(75) Inventor: Hong Gyu Kim, Uiwang-si (KR)

(73) Assignee: LG Display Co., Ltd., Seoul (KR)

(*) Notice: Subject to any disclaimer, the term of this patent is extended or adjusted under 35 U.S.C. 154(b) by 552 days.

(21) Appl. No.: 11/148,253

(22) Filed: Jun. 9, 2005

(65) Prior Publication Data
US 2005/0275344 A1 Dec. 15, 2005

(30) Foreign Application Priority Data
Jun. 10, 2004 (KR) .................. 10-2004-0042635

(51) Int. Cl.
*H01L 51/00* (2006.01)
*H05B 33/00* (2006.01)
*H05B 33/02* (2006.01)

(52) U.S. Cl. .............. 313/504; 313/503; 313/506; 313/512; 257/40; 257/79; 315/169.4; 445/24; 445/25

(58) Field of Classification Search .......... 313/504–512
See application file for complete search history.

(56) References Cited

U.S. PATENT DOCUMENTS

| | | | |
|---|---|---|---|
| 6,326,726 B1* | 12/2001 | Mizutani et al. | 313/504 |
| 7,005,677 B2* | 2/2006 | Park et al. | 257/72 |
| 2002/0195961 A1 | 12/2002 | Barth et al. | |
| 2003/0127972 A1* | 7/2003 | Han et al. | 313/504 |
| 2004/0017151 A1* | 1/2004 | Kim et al. | 313/504 |
| 2004/0069986 A1* | 4/2004 | Park et al. | 257/40 |
| 2005/0127825 A1* | 6/2005 | Bae et al. | 313/504 |
| 2005/0140281 A1* | 6/2005 | Park | 313/505 |
| 2005/0247936 A1 | 11/2005 | Bae et al. | |
| 2006/0081854 A1 | 4/2006 | Kim et al. | |

FOREIGN PATENT DOCUMENTS

| | | |
|---|---|---|
| CN | 1697578 A | 11/2005 |
| DE | 10 2005 020 939 A1 | 4/2006 |
| EP | 1 220 191 A2 | 7/2002 |

OTHER PUBLICATIONS

Bae et al., Korean Patent Application 10-2004-0018898, Mar. 2004, machine_translation.*

* cited by examiner

*Primary Examiner*—Sikha Roy
*Assistant Examiner*—Tracie Y Green
(74) *Attorney, Agent, or Firm*—Holland & Knight LLP (57) ABSTRACT

An organic electro-luminescent display and a method for manufacturing the same are disclosed. The organic electro-luminescent display includes a first transparent substrate and a second transparent substrate which are arranged to face each other while being spaced apart from each other by a predetermined distance, a transistor formed on the first transparent substrate, a spacer formed on the second transparent substrate, a first electrode formed on surfaces of the second transparent substrate and the spacer, and electrically connected to the transistor, an organic electro-luminescent layer formed on the first electrode, and a second electrode formed on the organic electro-luminescent layer, wherein the first electrode has a projecting part projected with the spacer toward the first substrate, exposed between neighboring organic electro-luminescent layers and between neighboring second electrodes so as to connect to the transistor.

18 Claims, 11 Drawing Sheets

ORGANIC ELECTRO-LUMINESCENT DISPLAY OF DUAL-PANEL TYPE AND METHOD FOR MANUFACTURING THE SAME

This application claims the benefit of Korean Patent Application No. 10-2004-0042635, filed on Jun. 10, 2004, which is hereby incorporated by reference as if fully set forth herein.

BACKGROUND OF THE INVENTION

1. Field of the Invention

The present invention relates to an organic electro-luminescent (EL) display, and more particularly, to a dual-panel type organic EL display and a method for manufacturing the same.

2. Discussion of the Related Art

Generally, dual-panel type organic EL displays include a lower substrate, on which pixel switching elements and pixel driving elements are formed, and an upper substrate, on which an organic material is laminated. The upper and lower substrates are bonded to be electrically connected, for implementation of a display.

Hereinafter, a conventional method for manufacturing such a dual-panel type organic EL display will be described.

The lower substrate of a dual-panel type organic EL display mainly includes, for each pixel region thereof, a switching thin film transistor (typically, a polysilicon thin film transistor) for switching of a pixel corresponding to the pixel region, a driving thin film transistor for driving of the pixel, a storage capacitor, and a pixel electrode.

Figure 1A:
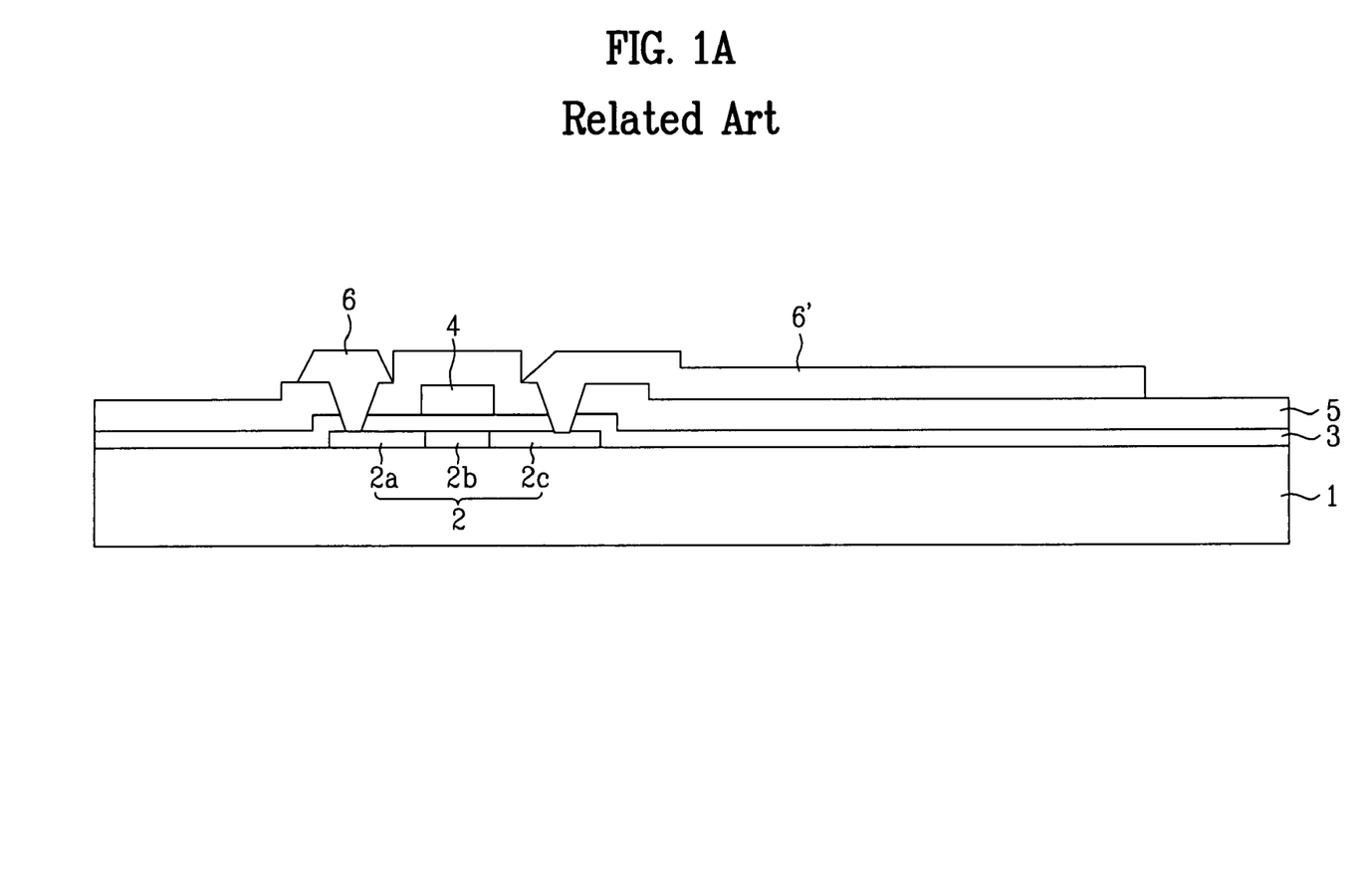
FIGS. 1A to 1D are sectional views illustrating a conventional method for manufacturing an organic EL display having a conventional structure.

FIG. 1A is a sectional view illustrating a conventional process for manufacturing a lower substrate of a dual-panel type organic EL display. The following description will be given only in conjunction with one thin film transistor included in one pixel of the dual-panel type organic EL display.

In accordance with the conventional process, first, a semiconductor layer 2 made of, for example, polysilicon, is formed over a transparent substrate 1, as shown in FIG. 1A. The semiconductor 2 is then patterned such that the semiconductor 2 remains only in a region where a thin film transistor is to be formed.

Thereafter, a gate insulating film 3 and a conductive film for formation of a gate electrode are sequentially formed over the entire surface of the resulting structure. The conductive film is then patterned to form a gate electrode 4.

Using the gate electrode 4 as a mask, impurity ions such as phosphorous (P) ions are then implanted into the semiconductor layer 2 which is, in turn, annealed to form source and drain regions 2a and 2c of the thin film transistor. Thus, an NMOS thin film transistor is completely formed.

The portion of the semiconductor layer 2, into which the impurity ions are not implanted, forms a channel region 2b of the NMOS thin film transistor.

Next, an interlayer insulating film 5 is formed over the entire surface of the resulting structure. Subsequently, the interlayer insulating film 5 and gate insulating film 3 are selectively removed such that the source and drain regions 2a and 2c of the NMOS thin film transistor are exposed.

An electrode line 6 and a pixel electrode 6' are then formed on the exposed source and drain regions 2a and 2c such that the electrode line 6 and pixel electrode 6' are electrically connected to the source and drain regions 2a and 2c, respectively. Thus, the lower substrate is completely formed.

Figure 1B:
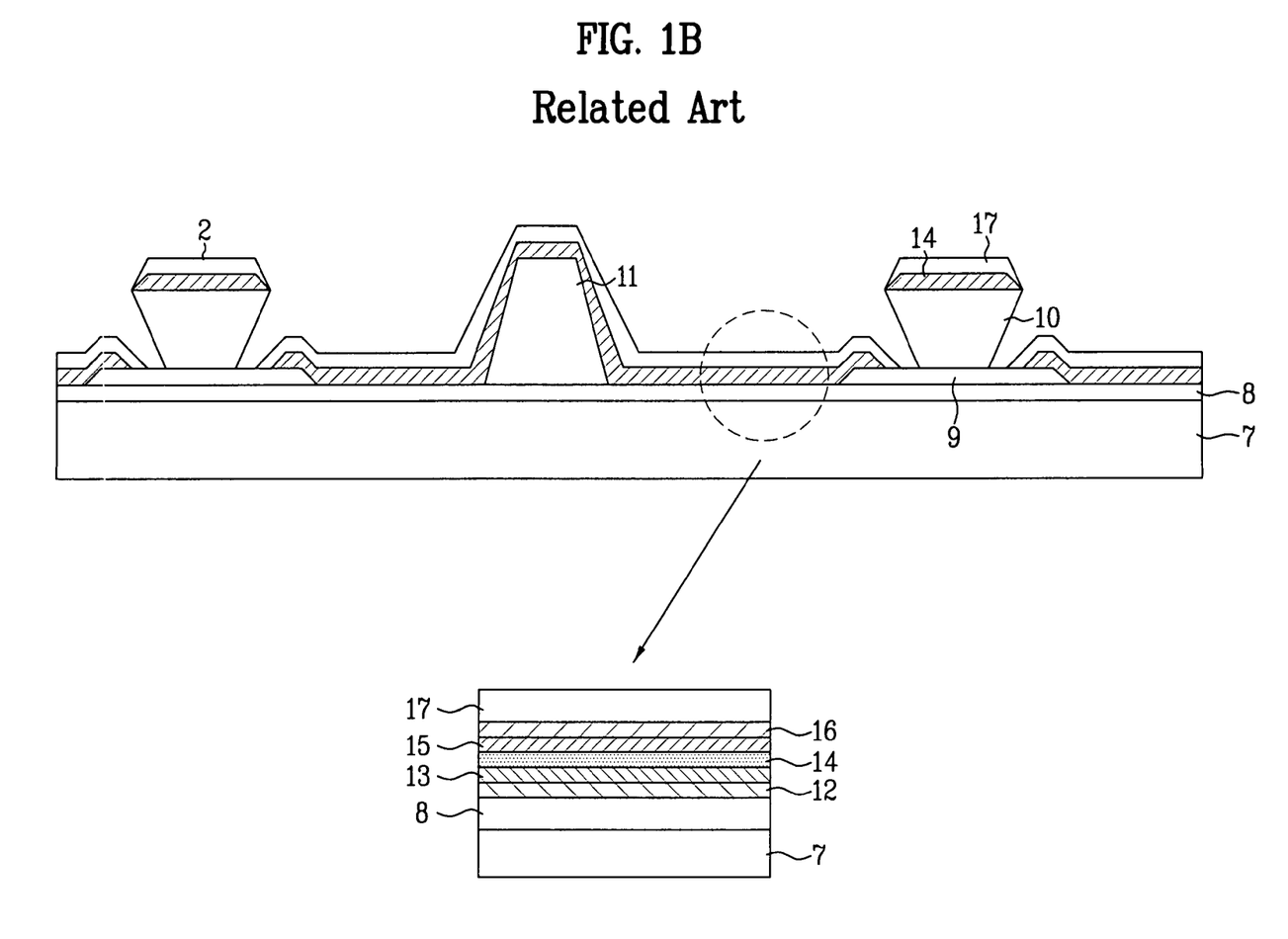
Figure 2:
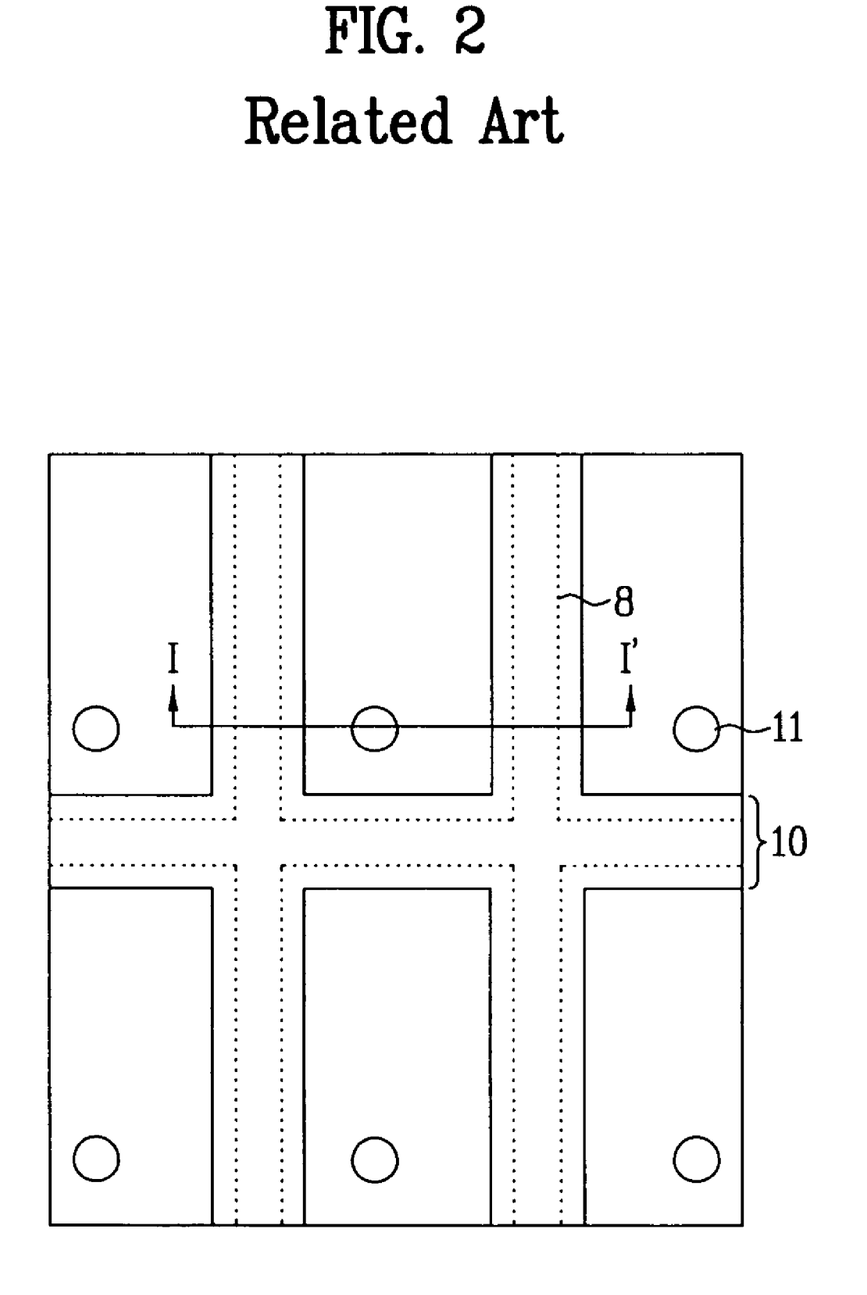
FIG. 2 is a plan view illustrating an upper substrate of the convention organic EL display.

FIG. 2 is a plan view illustrating an upper substrate of the dual-panel type organic EL display manufactured in accordance with a conventional process. FIG. 1B is a cross-sectional view taken along the line I-I of FIG. 2.

In accordance with the conventional process, as shown in FIGS. 1B and 2, an anode 8 is formed on a transparent substrate 7. The anode 8 is made of a transparent conductive material having a high work function, such as indium tin oxide (ITO) or indium zinc oxide (IZO).

Thereafter, an insulating film 9 is formed on a portion of the anode 8, using an insulating material such as polyimide. A barrier 10 is then formed on the insulating film 9.

Next, an island-shaped spacer 11 is formed on the anode 8 at a pixel region, using another insulating material.

Subsequently, organic materials for a hole injection layer 12, a hole transfer layer 13, a light-emitting layer 14, an electron transfer layer 15, and an electron injection layer 16 are sequentially deposited over the entire surface of the resulting structure including the spacer 11.

A cathode 17, which is made of a conductive material having a low work function, such as aluminum, is then deposited over the electron injection layer 16. Thus, the upper substrate is completely formed.

Figure 1C:
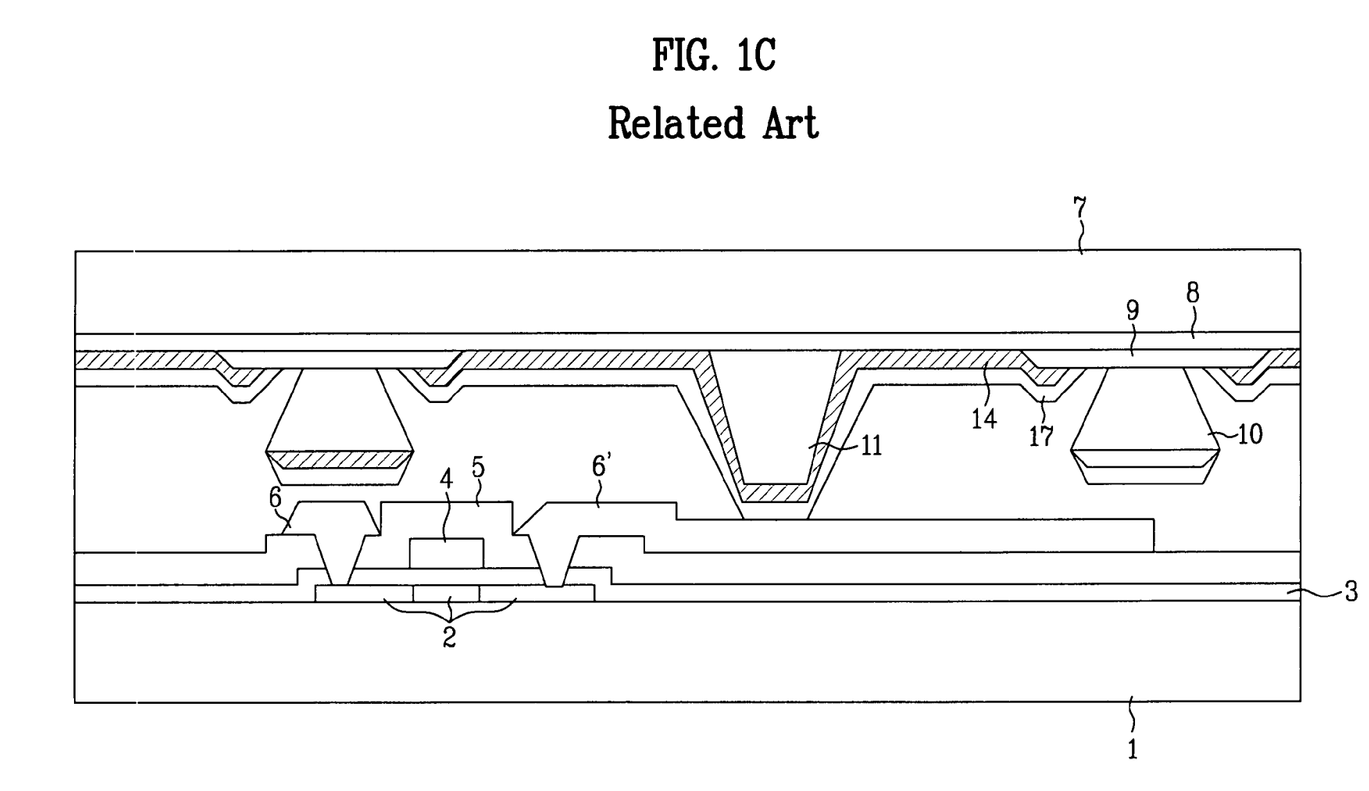

FIG. 1C is a sectional view illustrating a process for bonding the lower substrate of FIG. 1A and the upper substrate of FIG. 1B.

As shown in FIG. 1C, the lower substrate of FIG. 1A and the upper substrate of FIG. 1B are bonded such that the cathode 17 formed on the spacer 11 in the upper substrate comes into contact with the pixel electrode 6' to be electrically connected.

Figure 1D:
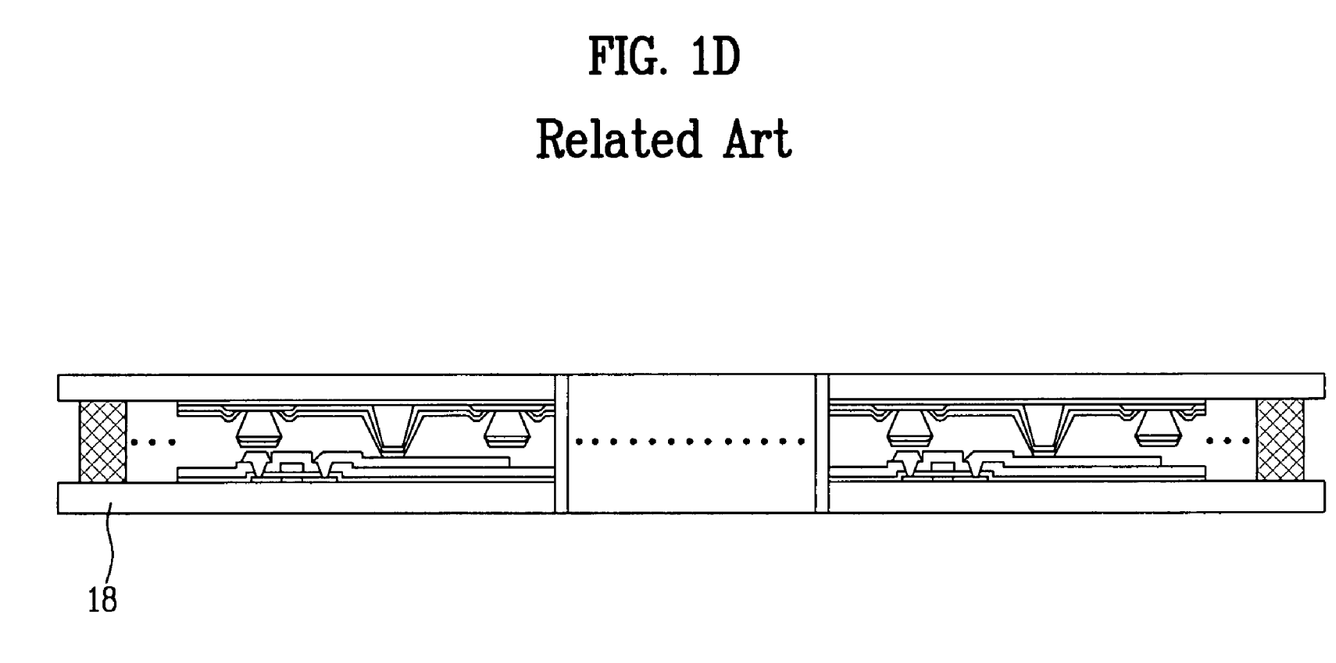

FIG. 1D is a sectional view illustrating a process for sealing the organic EL display in which the upper and lower substrates are bonded. As shown in FIG. 1D, vacuum is formed in a space defined between the bonded upper and lower substrates. Thereafter, the space between the upper and lower substrates is sealed, using a sealant 18.

In the conventional organic EL display manufactured in the above-mentioned manner, NMOS thin film transistors must be used because each cathode in the upper substrate and the drain region of the corresponding driving thin film transistor in the lower substrate are electrically connected.

However, the above-mentioned conventional EL display has a problem in that it is difficult to use a low-temperature polysilicon thin film transistor manufacturing process using a laser annealing method. This is because the low-temperature polysilicon thin film transistor is of a PMOS type.

For this reason, the conventional organic EL display cannot use PMOS thin film transistors which are more stable than NMOS thin film transistors.

SUMMARY OF THE INVENTION

Accordingly, the present invention is directed to an organic EL display and a method for manufacturing the same that substantially obviate one or more problems due to limitations and disadvantages of the related art.

An object of the present invention is to provide an organic EL display which can use PMOS thin film transistors, and a method for manufacturing the organic EL display.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electro-luminescent display comprises: a first transparent substrate and a second transparent substrate which are arranged to face each other while being spaced apart from each other by a predetermined distance; a transistor formed on the first transparent substrate; an anode formed on the second transparent substrate, and electrically connected to the transistor; an organic electro-luminescent layer formed on the anode; and a cathode formed on the organic electro-luminescent layer.

The transistor may be a PMOS thin film transistor. The organic electro-luminescent display may further comprise a spacer formed around a light emitting region on the second transparent substrate, and a barrier formed around the spacer.

The barrier may surround the spacer. Alternatively, the barrier may comprise stripe-shaped barriers respectively formed at opposite sides of the spacer such that the spacer is interposed between the stripe-shaped barriers.

The spacer may be protruded to a level higher than the barrier.

In another aspect of the present invention, an organic electro-luminescent display comprises: a first transparent substrate and a second transparent substrate which are arranged to face each other while being spaced apart from each other by a predetermined distance; a transistor formed on the first transparent substrate; a spacer formed around a light emitting region on the second transparent substrate; an anode formed on the light emitting region of the second transparent substrate and the spacer such that the anode has a portion formed on the light emitting region, and a portion formed on the spacer, the anode portion formed on the spacer being electrically connected to the transistor; a barrier formed around the spacer; an organic electro-luminescent layer formed on the anode portion formed on the light emitting region of the second transparent substrate, except for the spacer; and a cathode formed on the organic electro-luminescent layer.

The barrier may comprise a first barrier formed in a stripe on the anode at one side of the spacer, and a second barrier formed in a stripe on the second transparent substrate at the other side of the spacer.

In another aspect of the present invention, a method for manufacturing an organic electro-luminescent display comprises the steps of: manufacturing a lower substrate of the organic electro-luminescent display, the lower substrate manufacturing step comprising the steps of preparing a first transparent substrate, and forming a transistor on the first transparent substrate; manufacturing an upper substrate of the organic electro-luminescent display, the upper substrate manufacturing step comprising the steps of preparing a second transparent substrate, forming a spacer around a light emitting region on the second transparent substrate, forming an anode on the light emitting region of the second transparent substrate and the spacer, forming a barrier around the spacer, forming an organic electro-luminescent layer on a portion of the anode formed on the light emitting region of the second transparent substrate, except for the spacer, and forming a cathode on the organic electro-luminescent layer; and bonding the upper and lower plates of the organic electro-luminescent display such that a portion of the anode formed on the spacer in the upper substrate is electrically connected with an electrode of the transistor in the lower substrate.

The step of forming the barrier around the spacer may comprise the steps of: forming an insulating film over an entire surface of the second transparent substrate including the anode, and patterning the insulating film such that the insulating film remains only around the spacer to surround the spacer; and forming a barrier on the remaining insulating film.

The step of forming the barrier around the spacer may comprise the steps of: forming an insulating film over an entire surface of the second transparent substrate including the anode, and patterning the insulating film such that the insulating film remains to have stripe-shaped portions respectively arranged in parallel at opposite sides of the spacer to cause the spacer to be interposed between the stripe-shaped portions; and forming barriers on the remaining stripe-shaped insulating film portions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The present invention proposes a dual-panel type organic EL display having a structure capable of using PMOS thin film transistors, and a method for manufacturing the same.

That is, in accordance with the present invention, a PMOS thin film transistor is formed on one substrate of the dual-panel type organic EL display, as a device for driving of a pixel. Also, an organic EL element is formed on the other substrate. The substrates are then bonded such that an anode of the organic EL element and a pixel electrode of the PMOS thin film transistor are electrically connected.

FIGS. 3A to 3E are sectional views illustrating sequential processing steps of a method for manufacturing a dual-panel type EL display in accordance with the present invention. The following description will be given only in conjunction with one thin film transistor included in one pixel of the organic EL display.

Figure 3A:
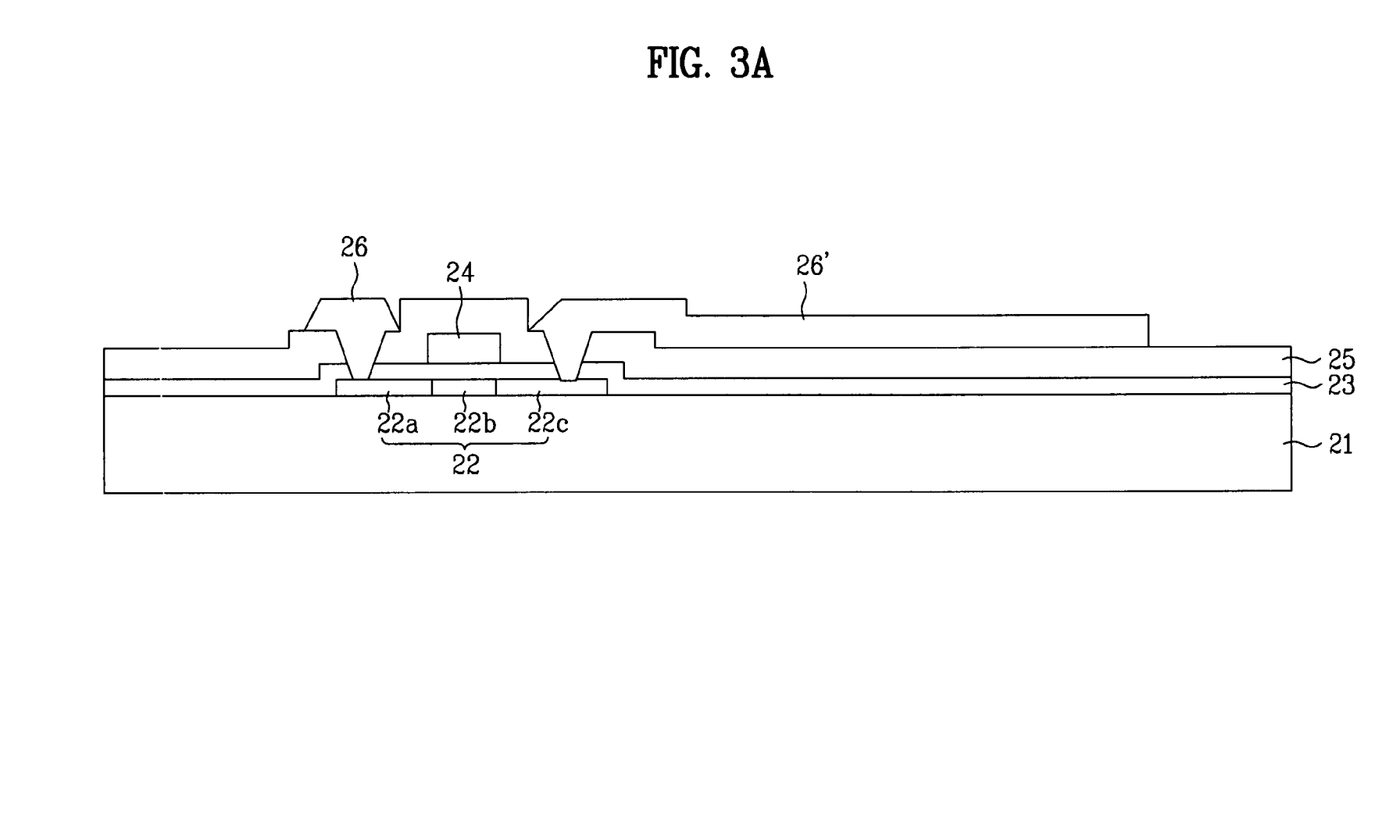
FIGS. 3A to 3D are sectional views illustrating a method for manufacturing a dual-panel type organic EL display in accordance with the present invention.

FIG. 3A is a sectional view illustrating a process for manufacturing a lower substrate of the dual-panel type EL display.

This process may be carried out in a conventional manner. In accordance with this process, first, a semiconductor layer 22 made of, for example, polysilicon, is formed over a first transparent substrate 21, as shown in FIG. 3A. The semiconductor layer 22 is then patterned to remain only in a region where a thin film transistor is to be formed.

Thereafter, a gate insulating film 23 and a conductive film for formation of a gate electrode are sequentially formed over the entire surface of the resulting structure. The conductive film is then patterned to form a gate electrode 24.

Using the gate electrode 24 as a mask, impurity ions such as boron (B) ions are then implanted into the semiconductor layer 22 which is, in turn, annealed to form source and drain regions 22a and 22c of the thin film transistor. Thus, a PMOS thin film transistor is completely formed.

The portion of the semiconductor layer 22, into which the impurity ions are not implanted, forms a channel region 22b of the PMOS thin film transistor.

Next, an interlayer insulating film 25 is formed over the entire surface of the resulting structure. The interlayer insulating film 25 and gate insulating film 23 are then selectively removed to expose the source and drain regions 22a and 22c of the PMOS thin film transistor.

Thereafter, an electrode line 26 and a pixel electrode 26' are formed on the resulting structure such that the electrode line 26 and pixel electrode 26' are electrically connected to the source and drain regions 22a and 22c, respectively. Thus, a lower substrate is completely formed.

Figure 3B:
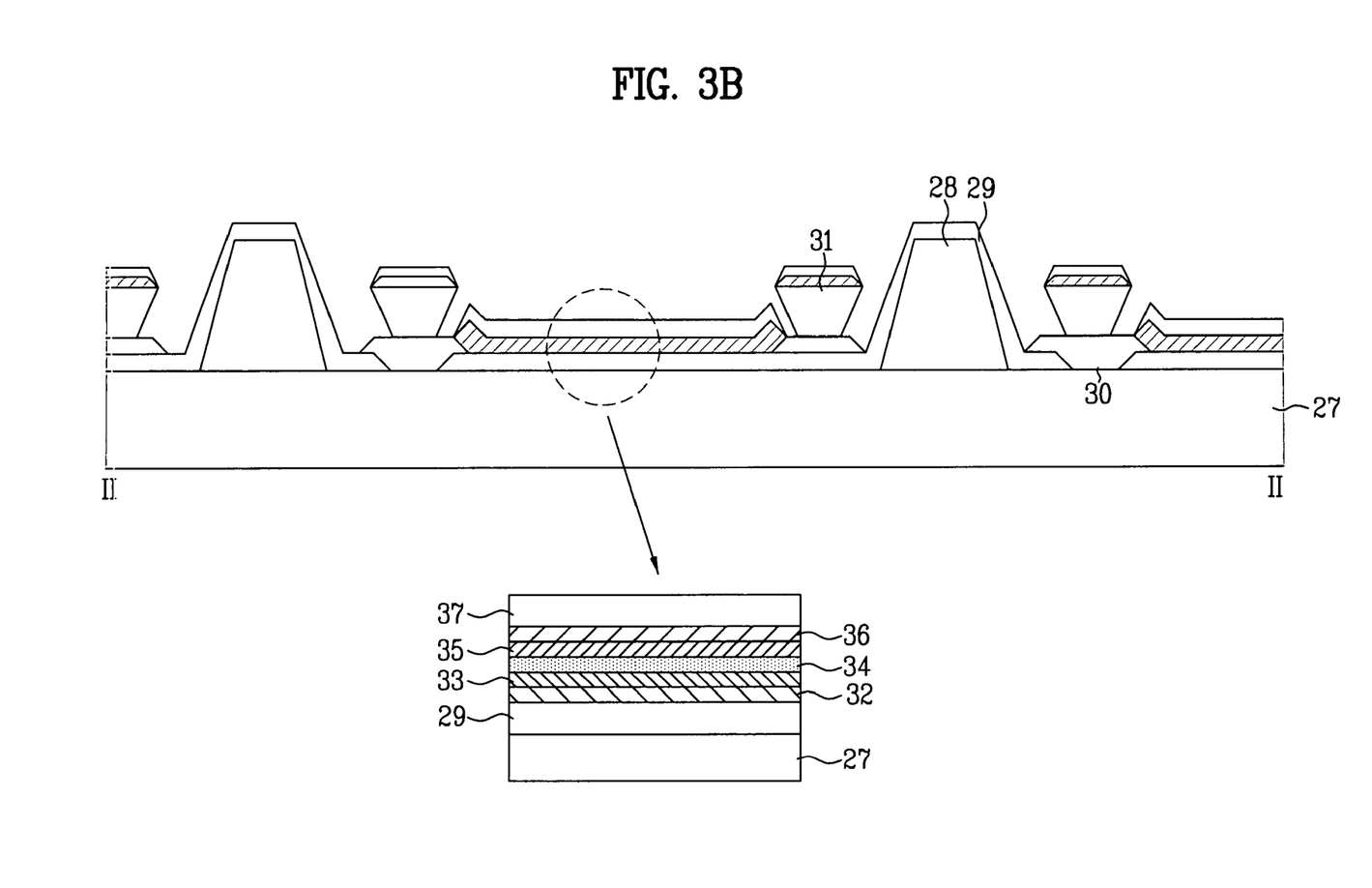
Figure 4A:
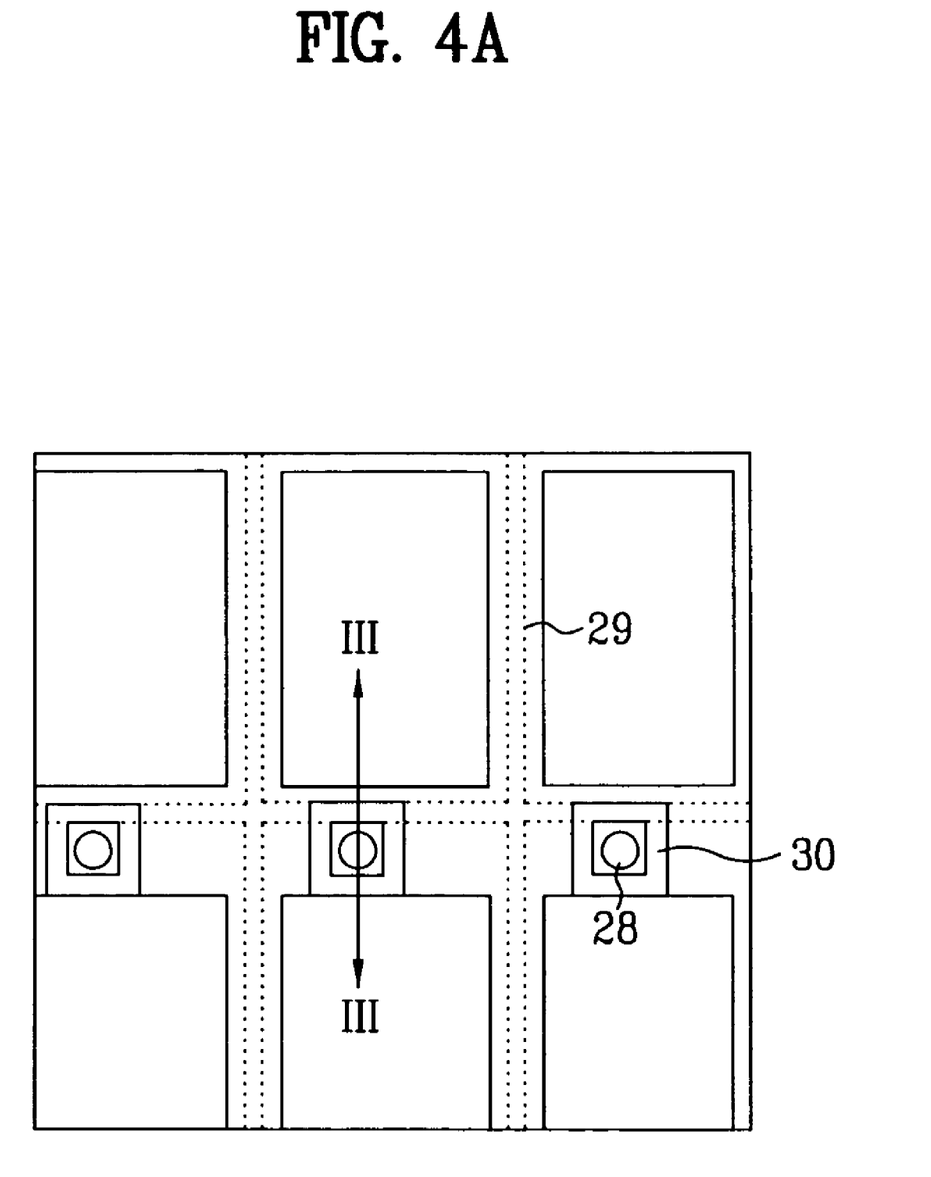
FIGS. 4A and 4B are plan views illustrating upper substrates having different structures, which are used in the organic EL display according to the present invention, respectively.
Figure 4B:
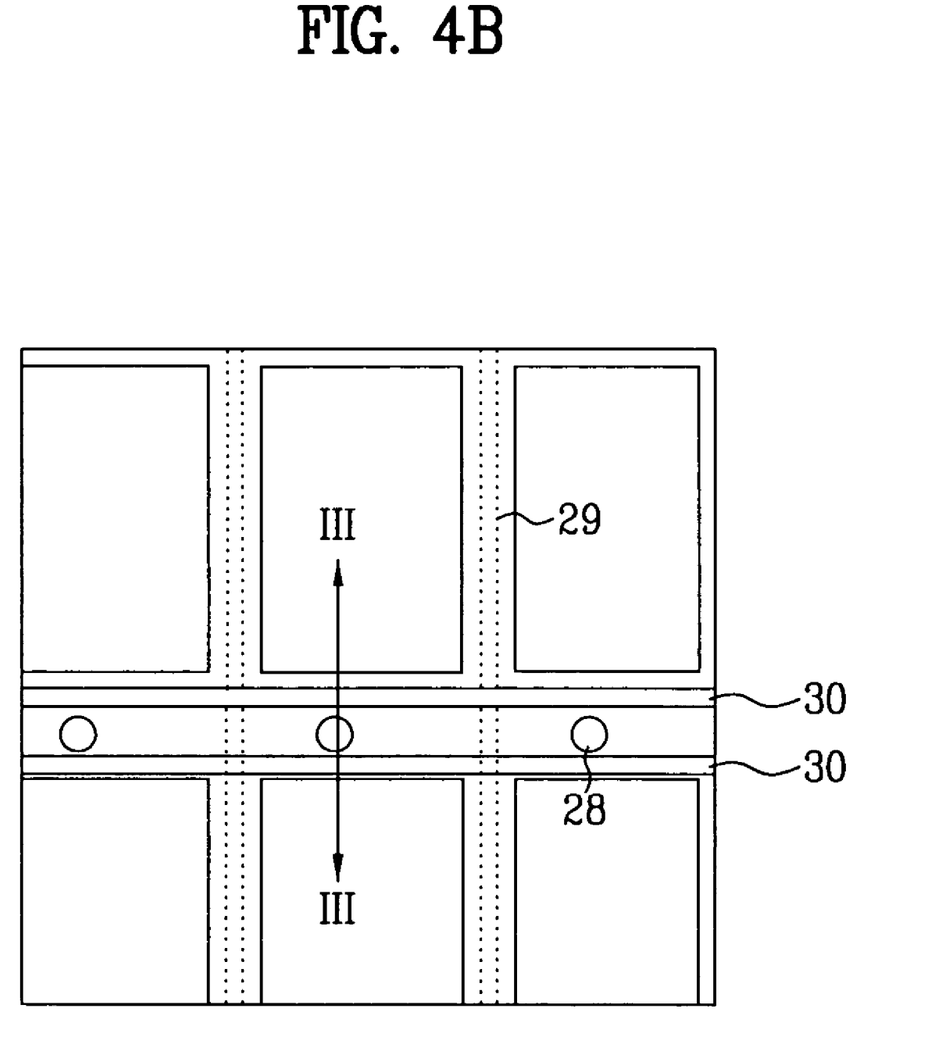

FIGS. 4A and 4B are plan views illustrating an upper substrate of the dual-panel type organic EL display manufactured in accordance with the present invention. FIG. 3B is a cross-sectional view taken along the line II-II of FIG. 4A and the line III-III of FIG. 4B, illustrating an upper substrate manufacturing process according to the present invention.

In accordance with the upper substrate manufacturing process, an island-shaped spacer 28 is first formed on a second transparent substrate 27, using an insulating material, as shown in FIG. 3B.

The spacer 28 is arranged around a light emitting region. The spacer 28 is also shaped such that the lower portion of the spacer 28 is wider than the upper portion of the spacer 28.

Thereafter, an anode (that is, a first electrode) 29 is formed on the second transparent substrate 27 including the spacer 28. The anode 29 is made of a transparent conductive material having a high work function, such as indium tin oxide (ITO) or indium zinc oxide (IZO).

The anode 29 is formed only on the spacer 28 and the light emitting region of the second transparent substrate 27.

Subsequently, an insulating film 30 is formed on a peripheral portion of the anode 29 and a region around the spacer 28, using an insulating material such as polyimide. A barrier 31 is then formed on the insulating film 30.

The insulating film 30 and barrier 31 may be formed using one of two methods.

In accordance with the first method, the insulating film 30 is first formed over the entire surface of the structure including the anode 29, is then patterned such that the insulating film 30 remains only around the spacer 28 to surround the spacer 28. The barrier 31 is then formed on the remaining insulating film 30 such that the barrier 31 surrounds the spacer 28.

In accordance with the second method, the insulating film 30 is first formed over the entire surface of the structure including the anode 29, is then patterned such that the insulating film 30 remains to have stripe-shaped portions respectively arranged in parallel at opposite sides of the spacer 28. The barrier 31 is then formed on the remaining insulating film 30.

In the latter case, the barrier 31 includes a first barrier formed in a stripe at one side of the spacer 28, and a second barrier formed in a stripe at the other side of the spacer 28. The first and second barriers are arranged in parallel in the form of parallel stripes at the opposite sides of the spacer 28, respectively, such that the spacer 28 is interposed between the first and second barriers.

Thereafter, organic materials for a hole injection layer 32, a hole transfer layer 33, a light-emitting layer 34, an electron transfer layer 35, and an electron injection layer 36 are sequentially deposited over a portion of the anode 29 corresponding to the light emitting region of the second transparent substrate 27, except for the spacer 28. Thus, an organic EL layer is formed.

In the organic EL layer forming process, a shadow mask is used in order to prevent the organic EL layer from being formed on the spacer 28.

A cathode (that is, a second electrode) 37, which is made of a conductive material having a low work function, such as aluminum, is then deposited over the electron injection layer 36. Thus, an upper substrate is completely formed.

Where the barrier 31 has the structure of FIG. 4A, the cathode 37 can be formed without using a shadow mask. However, where the barrier 31 has the structure of FIG. 4B, a shadow mask is used in the process of forming the cathode 37, so as to prevent the cathode 37 from being formed on a region where no organic EL layer is formed between the stripe-shaped barriers.

That is, in the latter case, it is necessary to expose the anode 29 formed on the spacer 28, so as to enable the anode 29 to come into electrical contact with the pixel electrode 26' of the first transparent substrate 21.

Figure 3C:
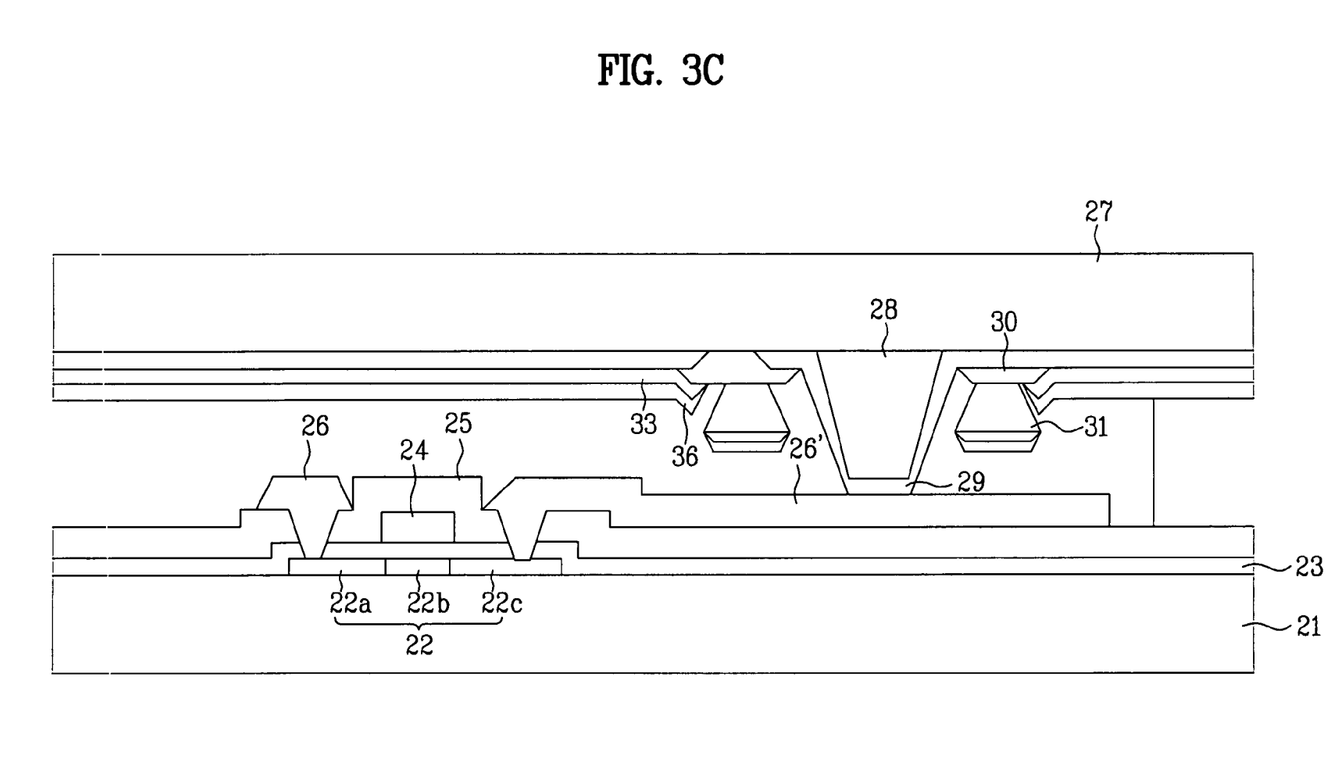

FIG. 3C is a sectional view illustrating a process for bonding the lower substrate of FIG. 3A and the upper substrate of FIG. 3B.

As shown in FIG. 3C, the lower substrate of FIG. 3A and the upper substrate of FIG. 3B are bonded such that the anode 29 formed on the spacer 28 in the upper substrate comes into contact with the pixel electrode 26' of the lower substrate to be electrically connected.

Figure 3D:
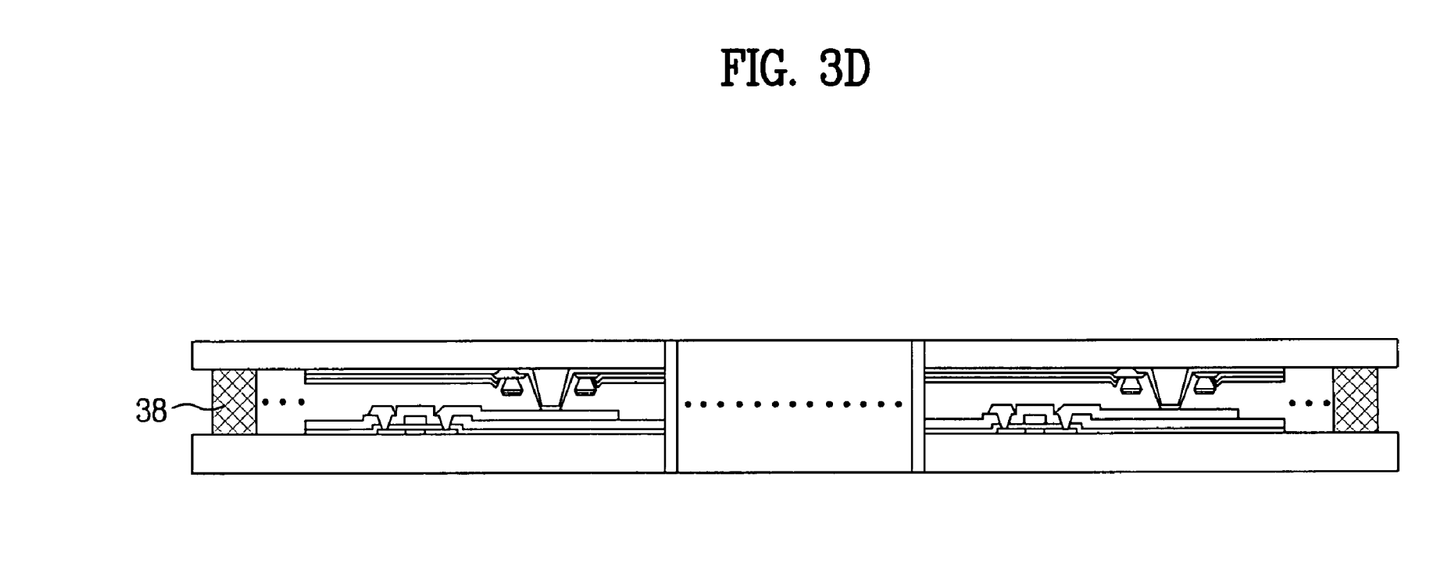

FIG. 3D is a sectional view illustrating a process for sealing the organic EL display in which the upper and lower substrates are bonded. As shown in FIG. 3D, a vacuum is formed in a space defined between the bonded upper and lower substrates. Thereafter, the space between the upper and lower substrates is sealed, using a sealant 38.

As apparent from the above description, the organic EL display of the present invention can use PMOS thin film transistors because the drain region of each driving thin film transistor formed on the lower substrate is electrically connected with the corresponding anode formed on the upper substrate.

That is, in accordance with the present invention, it is possible to manufacture a dual-panel type organic EL display having an enhanced reliability and a prolonged life, by virtue of use of PMOS thin film transistors which are more stable than NMOS thin film transistors.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electro-luminescent display comprising:
   a first transparent substrate and a second transparent substrate which are arranged to face each other while being spaced apart from each other by a predetermined distance;
   a transistor formed on the first transparent substrate;
   a spacer formed on the second transparent substrate;
   a first electrode formed on surfaces of the second transparent substrate and the spacer, and electrically connected to the transistor;
   an organic electro-luminescent layer formed on the first electrode; and
   a second electrode formed on the organic electro-luminescent layer,
   wherein the first electrode between the second transparent substrate and the organic electro-luminescent layer has a projecting part projected with the spacer toward the first substrate, exposed through an opening part between neighboring organic electro-luminescent layers and between neighboring second electrodes so as to connect to the transistor.

2. The organic electro-luminescent display according to claim 1, wherein the transistor is a PMOS thin film transistor and the first electrode is anode and the second electrode is cathode.

3. The organic electro-luminescent display according to claim 1, further comprising:
   the spacer formed around a light emitting region on the second transparent substrate; and
   a barrier formed around the spacer, wherein the barrier and the spacer are formed on the second transparent substrate.

4. The organic electro-luminescent display according to claim 3, wherein the barrier surrounds the spacer.

5. The organic electro-luminescent display according to claim 3, wherein the barrier comprises stripe-shaped barriers respectively formed at opposite sides of the spacer such that the spacer is interposed between the stripe-shaped barriers.

6. The organic electro-luminescent display according to claim 3, wherein the spacer is protruded to a level higher than the barrier.

7. An organic electro-luminescent display comprising:
   a first transparent substrate and a second transparent substrate which are arranged to face each other while being spaced apart from each other by a predetermined distance;
   a transistor formed on the first transparent substrate;
   a spacer formed around a light emitting region on the second transparent substrate;
   a first electrode formed on surfaces of the second transparent substrate and the spacer such that the first electrode has a portion formed on the light emitting region of the surface of the first transparent substrate, and a portion formed on the surface of the spacer, the first electrode portion formed on the spacer being electrically connected to the transistor;
   a barrier formed around the spacer, wherein the barrier and the spacer are formed on the second transparent substrate;
   an organic electro-luminescent layer formed on the first electrode portion formed on the light emitting region of the second transparent substrate, except for the spacer; and
   a second electrode formed on the organic electro-luminescent layer,
   wherein the first electrode portion, between the second transparent substrate and the organic electro-luminescent layer, on the spacer is exposed through an opening part between neighboring organic electro-luminescent layers and between neighboring second electrodes so as to connect to the transistor.

8. The organic electro-luminescent display according to claim 7, wherein the transistor is a PMOS thin film transistor and the first electrode is anode and the second electrode is cathode.

9. The organic electro-luminescent display according to claim 7, wherein the barrier surrounds the spacer.

10. The organic electro-luminescent display according to claim 7, wherein the barrier comprises:
    a first barrier formed in a stripe on the first electrode at one side of the spacer; and
    a second barrier formed in a stripe on the second transparent substrate at the other side of the spacer.

11. The organic electro-luminescent display according to claim 10, further comprising:
    an insulating film formed beneath the first and second barriers.

12. The organic electro-luminescent display according to claim 10, wherein the first and second barriers are arranged in parallel at the opposite sides of the spacer such that the spacer is interposed between the first and second barriers.

13. The organic electro-luminescent display according to claim 7, wherein the spacer is protruded to a level higher than the barrier.

14. A method for manufacturing an organic electro-luminescent display, comprising the steps of:
    manufacturing a lower substrate of the organic electro-luminescent display, the lower substrate manufacturing step comprising the steps of preparing a first transparent substrate, and forming a transistor on the first transparent substrate;
    manufacturing an upper substrate of the organic electro-luminescent display, the upper substrate manufacturing step comprising the steps of preparing a second transparent substrate, forming a spacer around a light emitting region on a surface of the second transparent substrate, forming a first electrode on the surfaces of the second transparent substrate and the spacer, forming a barrier around the spacer, forming an organic electro-luminescent layer on a portion of the first electrode formed on the light emitting region of the second transparent substrate, except for the spacer, and forming a-second electrode on the organic electro-luminescent layer; and
    bonding the upper and lower plates of the organic electro-luminescent display such that a portion of the first electrode formed on the spacer in the upper substrate is electrically connected with an electrode of the transistor in the lower substrate,
    wherein the first electrode between the second transparent substrate and the organic electro-luminescent layer has a projecting part projected with the spacer toward the first substrate, exposed through an opening part between neighboring organic electro-luminescent layers and between neighboring second electrodes so as to connect to the transistor, and
    wherein the barrier and the spacer are formed on the second transparent substrate.

15. The method according to claim 14, wherein the step of forming the barrier around the spacer comprises the steps of:
    forming an insulating film over an entire surface of the second transparent substrate including the first electrode, and patterning the insulating film such that the insulating film remains only around the spacer to surround the spacer; and forming a barrier on the remaining insulating film.

16. The method according to claim 14, wherein the step of forming the barrier around the spacer comprises the steps of:

forming an insulating film over an entire surface of the second transparent substrate including the first electrode, and patterning the insulating film such that the insulating film remains to have stripe-shaped portions respectively arranged in parallel at opposite sides of the spacer to cause the spacer to be interposed between the stripe-shaped portions; and forming barriers on the remaining stripe-shaped insulating film portions.

17. The method according to claim 16, wherein the step of forming the second electrode is executed using a shadow mask to prevent the second electrode from being formed between the barriers.

18. The method according to claim 14, wherein the step of forming the organic electro-luminescent layer is executed using a shadow mask to prevent the organic electro-luminescent layer from being formed on the spacer.

* * * * *